United States Patent
Khan et al.

(10) Patent No.: US 9,606,769 B2
(45) Date of Patent: Mar. 28, 2017

(54) SYSTEM AND METHOD FOR ADAPTIVE COMPRESSION MODE SELECTION FOR BUFFERS IN A PORTABLE COMPUTING DEVICE

(71) Applicant: QUALCOMM INCORPORATED, San Diego, CA (US)

(72) Inventors: Moinul Khan, San Diego, CA (US); Chia-Yuan Teng, San Diego, CA (US); Simo Petteri Kangaslampi, San Diego, CA (US)

(73) Assignee: QUALCOMM INCORPORATED, San Diego, CA (US)

(*) Notice: Subject to any disclaimer, the term of this patent is extended or adjusted under 35 U.S.C. 154(b) by 337 days.

(21) Appl. No.: 14/304,611

(22) Filed: Jun. 13, 2014

(65) Prior Publication Data
US 2015/0286467 A1    Oct. 8, 2015

Related U.S. Application Data

(60) Provisional application No. 61/975,798, filed on Apr. 5, 2014.

(51) Int. Cl.
*G06F 13/36* (2006.01)
*G06F 5/12* (2006.01)
(Continued)

(52) U.S. Cl.
CPC ............ *G06F 5/12* (2013.01); *G06F 13/1673* (2013.01); *G11C 7/1072* (2013.01); *H03M 7/30* (2013.01);
(Continued)

(58) Field of Classification Search
CPC .... G06F 5/12; G06F 13/1673; H03M 7/6064; H03M 7/30; H03M 7/6094; H03M 7/6088; G11C 7/1072
See application file for complete search history.

(56) References Cited

U.S. PATENT DOCUMENTS 5,748,904 A * 5/1998 Huang .................... G06T 9/005
                                                      345/544
5,838,664 A * 11/1998 Polomski ................ H04N 7/15
                                                      348/14.09

(Continued)

OTHER PUBLICATIONS

Anonymous: "AMD Embedded G-Series SOC (Family 16h Models 00h-OFh) Product Data Sheet", AMD internet article, Feb. 28, 2014 (Feb. 28, 2014), pp. 1-12, XP002741746, Retrieved from the Internet: URL: http://support.amd.com/TechDocs/52259_KB_G-Series_Product_Data_Sheet.pdf [retrieved on Jul. 3, 2015] the whole document.

(Continued)

*Primary Examiner* — Jing-Yih Shyu
(74) *Attorney, Agent, or Firm* — Smith Tempel

(57) ABSTRACT

Systems and methods for adaptive compression mode selection for memory buffers such as those used in or with a portable computing device ("PCD") are presented. During operation of the PCD a first compression mode is selected for a buffer and the buffer is formatted to the first compression mode. Any access to the buffer by a component of the PCD, core of the PCD or software application running on the PCD is monitored. Based on the amount and/or type of access to the buffer, a second compression mode for the buffer is selected. The buffer is formatted to the second compression mode, providing a cost effective ability to adaptively format buffers based on the component(s), cores(s), and/or software application(s) accessing the buffers, and allowing for improving or optimizing bandwidth, memory footprint, resource conflict, power consumption, latency, and/or performance of component(s), core(s), or software application(s) accessing buffers as desired.

30 Claims, 9 Drawing Sheets

(51) Int. Cl.
*G06F 13/16* (2006.01)
*G11C 7/10* (2006.01)
*H03M 7/30* (2006.01)

(52) U.S. Cl.
CPC ....... *H03M 7/6064* (2013.01); *H03M 7/6088* (2013.01); *H03M 7/6094* (2013.01)

(56) References Cited

U.S. PATENT DOCUMENTS

| | | | |
|---|---|---|---|
| 5,991,515 A * | 11/1999 | Fall | G06T 9/00 358/1.12 |
| 6,195,024 B1 | 2/2001 | Fallon | |
| 6,615,173 B1 * | 9/2003 | Celi, Jr. | H04L 29/06027 704/201 |
| 7,190,284 B1 * | 3/2007 | Dye | G06F 12/023 341/51 |
| 7,386,046 B2 | 6/2008 | Fallon et al. | |
| 7,783,781 B1 | 8/2010 | Rothstein et al. | |
| 2001/0054131 A1 * | 12/2001 | Alvarez, II | H03M 7/30 711/105 |
| 2003/0092382 A1 * | 5/2003 | Vayanos | H04W 52/26 455/13.4 |
| 2006/0115164 A1 * | 6/2006 | Cooley | H04N 19/593 382/232 |
| 2006/0123035 A1 * | 6/2006 | Ivie | G06F 17/30595 |
| 2007/0104118 A1 * | 5/2007 | Mega | H04L 12/2602 370/254 |
| 2008/0059648 A1 * | 3/2008 | Manges | H04N 21/23431 709/231 |
| 2010/0303146 A1 | 12/2010 | Kamay | |
| 2011/0102546 A1 * | 5/2011 | Dhuse | G06F 11/1004 348/46 |
| 2011/0243469 A1 | 10/2011 | McAllister et al. | |
| 2012/0114045 A1 * | 5/2012 | Teng | H04N 7/50 375/240.24 |
| 2013/0010864 A1 * | 1/2013 | Teng | H04N 19/176 375/240.12 |
| 2014/0219558 A1 * | 8/2014 | Teng | G06T 9/00 382/166 |

OTHER PUBLICATIONS

Cunningham A., "The PC inside your phone: A guide to the system-on-a-chip", arstechnica internet article, Apr. 11, 2013 (Apr. 11, 2013), XP002741704, Retrieved from the Internet: URL: http://arstechnica.com/gadgets/2013/04/the-pc-inside-your-phone-a-guide-to-the-system-on-a-chip/.

International Search Report and Written Opinion—PCT/US2015/024356—ISA/EPO—Jul. 17, 2015.

"Texture tiling and swizzling", The ryg blog internet article, Jan. 17, 2011 (Jan. 17, 2011), XP002741743, Retrieved from the Internet: URL: https://fgiesen.wordpress.com/2011/01/17/texture-tiling-and-swizzling/ [retrieved on Jul. 10, 2015] the whole document.

* cited by examiner

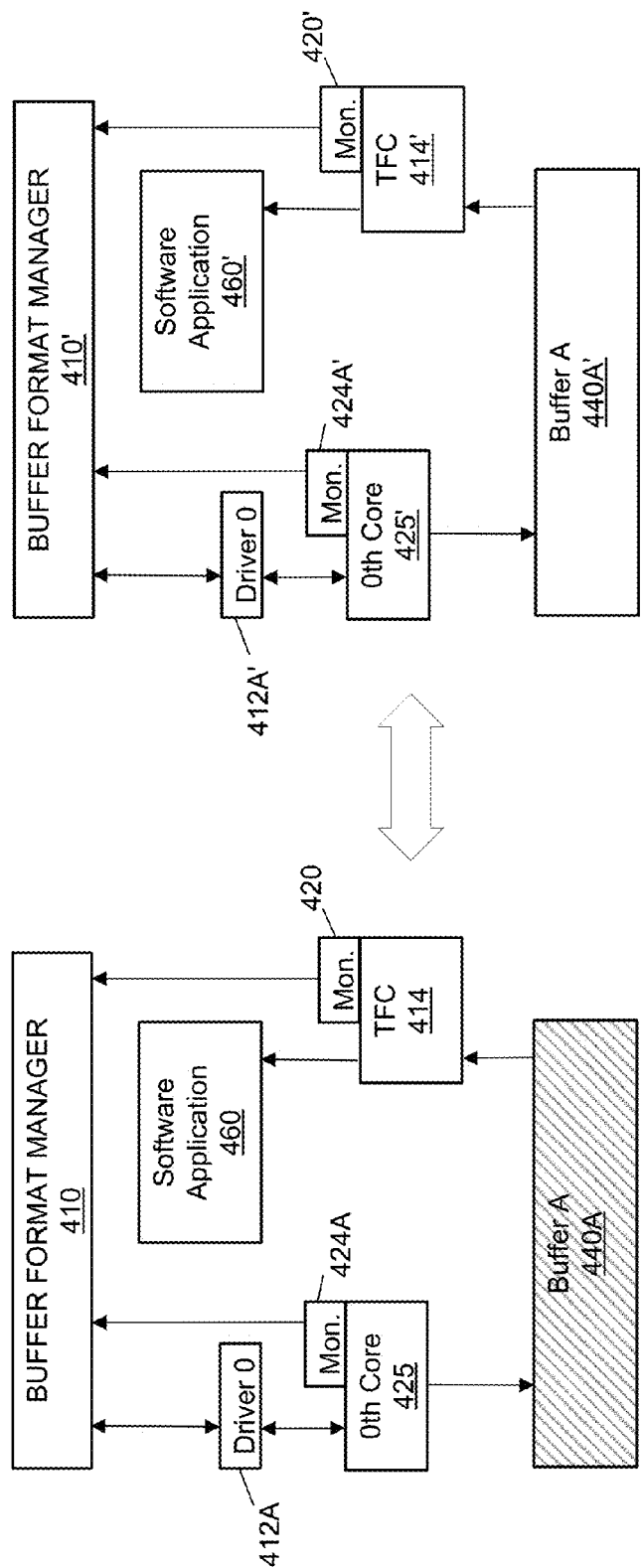

SYSTEM AND METHOD FOR ADAPTIVE COMPRESSION MODE SELECTION FOR BUFFERS IN A PORTABLE COMPUTING DEVICE

CLAIM OF PRIORITY UNDER 35 U.S.C. §119

The present Application for patent claims priority to Provisional Application No. 61/975,798, entitled "System And Method For Adaptive Compression Mode Selection For Buffers In A Portable Computing Device" filed Apr. 5, 2014, and assigned to the assignee hereof and hereby expressly incorporated by reference herein.

DESCRIPTION OF THE RELATED ART

Devices with a processor that communicate with other devices through wireless signals, including portable computing devices (PCDs), are ubiquitous. These devices may include cellular telephones, portable digital assistants (PDAs), portable game consoles, palmtop computers, and other portable electronic devices. In addition to the primary function of these devices, many include peripheral functions. For example, a cellular telephone may include the primary function of enabling and supporting cellular telephone calls and the peripheral functions of a still camera, a video camera, global positioning system (GPS) navigation, web browsing, sending and receiving emails, sending and receiving text messages, push-to-talk capabilities, etc.

PCDs typically use dynamic random access memory (DRAM), such as double data rate (DDR) type memory. Such devices also typically include a system on a chip (SoC) comprising a memory controller in communication with one or more cores (e.g., central processing unit(s) (CPUs), graphics processing unit(s) (GPU), digital signal processor(s) (DSPs), etc.) for controlling read or write requests to the DDR memory, including DDR memory allocated as buffers for one or more core.

As the functionality of such a device increases, and in particular the multi-media functionality, the memory and/or buffers required to support such functionality at desired service levels also increases. There have been attempts to maximize the available buffer space and buffer bandwidth, such as by the use of compression of the data going into the buffers. However, compressing data can itself be a time consuming effort, especially for multi-media data, that provides few gains when compression is applied in a one-size-fits-all manner. Additionally, efforts to maximize the benefits of compression typically assume a standard configuration for the buffers, and focus on the content of the data itself to choose an appropriate compression algorithm to apply to the specific data type, which can also be time consuming and inefficient.

Thus, there is a need for improved mechanisms for optimizing the application of compression modes to data buffers in a PCD.

SUMMARY OF THE DISCLOSURE

Systems and methods are disclosed that allow for dynamic and adaptive compression mode selection for memory buffers such as those used in or with a portable computing device ("PCD"). During operation of the PCD a first compression mode for a buffer of the PCD is selected. The buffer is formatted to the first compression mode, and access to the buffer is monitored. Based on the monitored access a second compression mode for the buffer is selected, and the buffer is formatted to the second compression mode.

One example embodiment is a PCD including a buffer and a first component in communication with the buffer, where the first component configured to write a set of data into the buffer. The buffer format manager is in communication with the first component, and the buffer format manager is configured to select a first compression mode for the buffer. A second component is in communication with the buffer, and the second component configured to access at least a portion of the set of data within the buffer. A monitor configured to monitor the access to the buffer by the second component is in communication with the buffer format manager. The buffer format manager is further configured to receive information from the monitor relating to the access to the buffer by the second component, and to select a second compression mode for the buffer based on the received information from the monitor.

Another example embodiment is a computer program product comprising a non-transitory computer usable medium having a computer readable program code embodied therein, said computer readable program code adapted to be executed to implement a method for adaptive compression mode selection for memory buffers in a portable computing device (PCD). The implemented method comprises: selecting a first compression mode for a buffer of the PCD; formatting the buffer to the first compression mode; monitoring an access to the buffer; selecting a second compression mode for the buffer based on the monitored access; and formatting the buffer to the second compression mode.

Yet another example embodiment is a computer system for adaptive compression mode selection for memory buffers in a portable computing device (PCD), the system comprising: means for selecting a first compression mode for a buffer of the PCD; means for formatting the buffer to the first compression mode; means for monitoring an access to the buffer; and means for selecting a second compression mode for the buffer based on the monitored access.

BRIEF DESCRIPTION OF THE DRAWINGS

In the drawings, like reference numerals refer to like parts throughout the various views unless otherwise indicated. For reference numerals with letter character designations such as "102A" or "102B", the letter character designations may differentiate two like parts or elements present in the same figure. Letter character designations for reference numerals may be omitted when it is intended that a reference numeral to encompass all parts having the same reference numeral in all figures.

FIG. 6A is a block diagram showing an exemplary operation of another aspect of the system illustrated in FIG. 4.

FIG. 6B is a block diagram showing another exemplary operation of the aspect illustrated in FIG. 6A.

DETAILED DESCRIPTION

Figure 1:
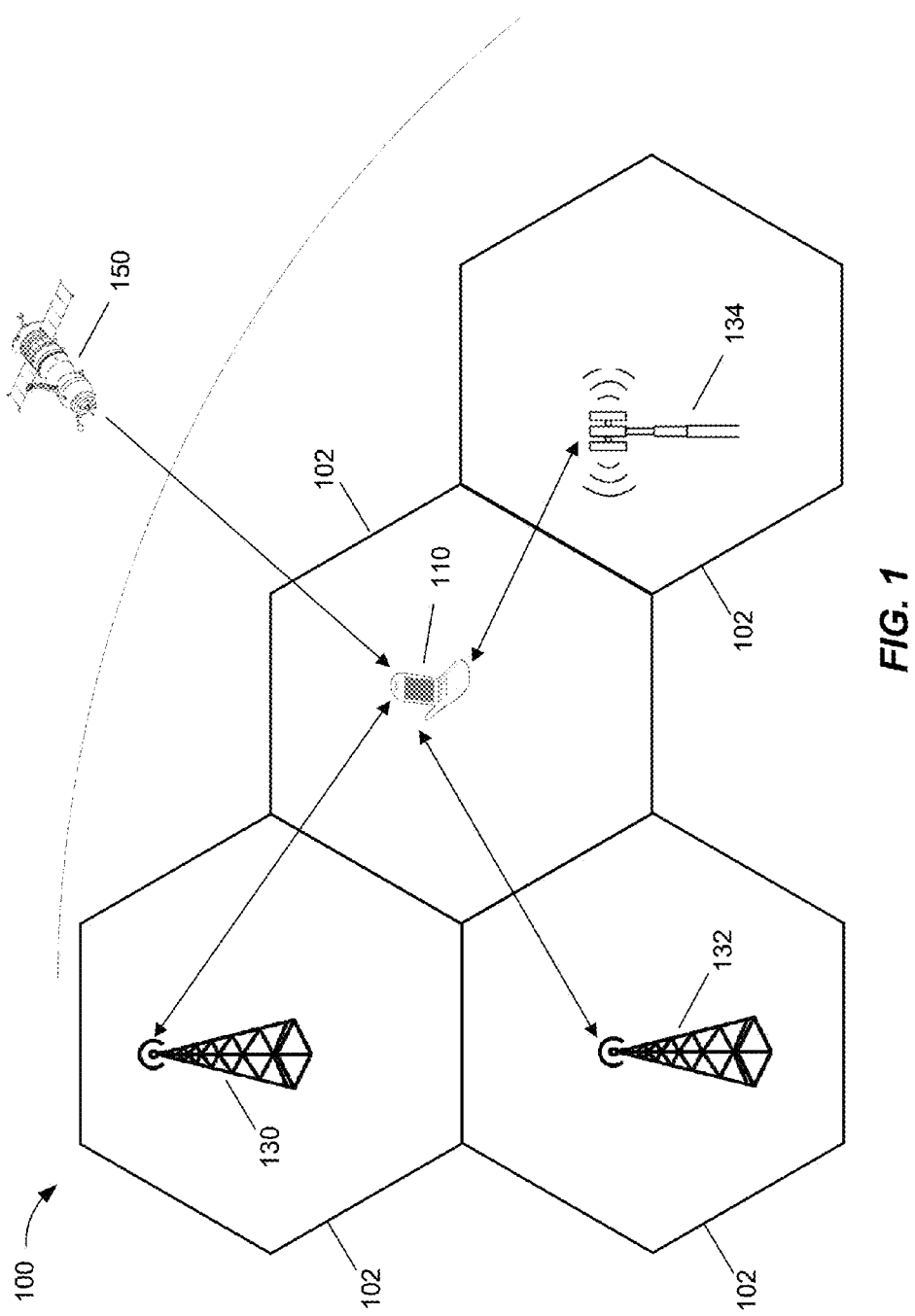
FIG. 1 is a diagram showing a portable computing device (PCD) communicating with a wireless communication system.

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files or data values that need to be accessed.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer-readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

In this description, the term "portable computing device" ("PCD") is used to describe any device operating on a limited capacity rechargeable power source, such as a battery and/or capacitor. Although PCDs with rechargeable power sources have been in use for decades, technological advances in rechargeable batteries coupled with the advent of third generation ("3G") and fourth generation ("4G") wireless technology have enabled numerous PCDs with multiple capabilities. Therefore, a PCD may be a cellular telephone, a satellite telephone, a pager, a PDA, a smartphone, a navigation device, a smartbook or reader, a media player, a combination of the aforementioned devices, a laptop or tablet computer with a wireless connection, among others.

The present systems and methods for adaptive compression mode selection for memory buffers such as those used in or with a portable computing device ("PCD") provide a cost effective ability to dynamically and adaptively format buffers based on the component(s), cores(s), and/or software application(s) accessing the buffers—i.e. formatting the buffers based on what is accessing the data in the buffer (and/or how that data is being accessed). The present systems and methods allow for improving or optimizing among other things, bandwidth, memory footprint, reduced resource conflict, power consumption, latency, improved performance of component(s), core(s), or software application(s) accessing buffers as desired.

During operation of the PCD a first compression mode is selected for a buffer of the PCD and the buffer is formatted to the first compression mode such that data written into the buffer will be either compressed or uncompressed and stored in accordance with the first compression mode. Any access to the buffer by a component of the PCD, core of the PCD or software application running on the PCD is monitored. Based on the amount and/or type of access to the buffer, a second compression mode for the buffer is selected. The second compression mode may be different from the first compression mode. The buffer is then formatted to the second compression mode such that any data written into the buffer going forward will be either compressed or uncompressed and stored in accordance with the second compression mode. In this manner a single data stream being written into a buffer may be written into the buffer in a first compression mode at one point in time, and may be written into the buffer in a second, different compression mode at another point in time, depending on whether (and how) the data in the buffer is being accessed.

In an example embodiment, a PCD includes a buffer and a first component in communication with the buffer and configured to write a set of data into the buffer. The PCD also includes a buffer format manager in communication with the first component, the buffer format manager configured to select a first compression mode for the buffer. The PCD further includes a second component in communication with the buffer. The second component is configured to access at least a portion of the set of data within the buffer. Finally, the PCD includes a monitor in communication with the buffer format manager, the monitor configured to monitor the second component's access to the buffer. The buffer format manager is configured to receive information from the monitor relating to the access to the buffer by the second component. The buffer format manager is also configured to select, based on the received information from the monitor, a second compression mode for the buffer.

This ability to adaptively re-format the buffer as desired during operation provides several advantages. One exemplary advantage is the ability to better optimize bandwidth. Implementing the present systems and methods may allow for the PCD to automatically set buffers to a maximum compression to improve bandwidth (and reduce) buffer memory footprint, but then later alter to compression format of a particular buffer while it is receiving a data stream in the event that the information in the buffer is needed by a core or software application of the PCD. For example, a software application may require access to the data being written into the buffer and the software application may require the data in an uncompressed format. In that event, the operations of compressing the data, placing the compressed data in the buffer, retrieving and decompressing the data, and providing the uncompressed data to the software may reduce bandwidth more than if the data was just stored in the buffer in an uncompressed format in the first place. The present systems and methods allow for this determination to be made, and for the buffer compression mode to be adaptively changed such that the next data from the data stream written into the buffer is in uncompressed format in order to optimize the bandwidth. Similarly, if the software application stops accessing the buffer, such that there is no immediate need for the uncompressed data, the present systems and methods allow for the buffer to be re-formatted again, this time back to maximum compression, such that the rest of the data stream is stored in the buffer at maximum compression, to optimize bandwidth (and/or reduce memory footprint).

Such determinations of the buffer compression mode for a given point in time may also take into consideration other factors in addition to the access to the buffer. For example, the determination or selection of a buffer compression mode at a given time may also be based in part on bandwidth optimization, memory footprint optimization, optimizing operation of the component(s), core(s), software, or application(s) accessing the data in a buffer, the intended use of the PCD, the PCD architecture, the size and number of the buffers available, whether the available buffers are shared with other processors of the PCD performing other functions, a battery level of the PCD, power consumption of the PCD, thermal conditions of the PCD, etc. as desired.

Although described with particular reference to operation within a PCD, the described adaptive compression mode selection for memory buffers systems and methods are applicable to any larger system with a processor, or processing subsystem, and a state or mode driven modem where it is desirable to conserve power consumption, enhance performance, or improve quality of service. Stated another way, the adaptive compression mode selection for memory buffers may be provided to dynamically and adaptively select or determine compression modes for buffer memory in a system other than in a portable device.

The system for adaptive compression mode selection for memory buffers described herein, or portions of the system, may be implemented in hardware or software. If implemented in hardware, the devices can include any, or a combination of, the following technologies, which are all well known in the art: discrete electronic components, an integrated circuit, an application-specific integrated circuit having appropriately configured semiconductor devices and resistive elements, etc. Any of these hardware devices, whether acting or alone, with other devices, or other components such as a memory may also form or comprise components or means for performing various operations or steps of the disclosed methods.

When a PCD or other system described herein is implemented, or partially implemented, in software, the software portion can be used to select a first compression mode for a buffer of the PCD, format the buffer to the first compression mode, monitor an access to the buffer, select a second compression mode for the buffer based on the monitored access, or format the buffer to the second compression mode. The software and data used in representing various elements can be stored in a memory and executed by a suitable instruction execution system (microprocessor). The software may comprise an ordered listing of executable instructions for implementing logical functions, and can be embodied in any "processor-readable medium" for use by or in connection with an instruction execution system, apparatus, or device, such as a single or multiple-core processor or processor-containing system. Such systems will generally access the instructions from the instruction execution system, apparatus, or device and execute the instructions.

FIG. 1 is a diagram showing a wireless device 110 communicating with a wireless communication system 100 in which embodiments of the present disclosure may be employed. The wireless communication system 100 may be broadband wireless communication system, including a Long Term Evolution (LTE) system, a Code Division Multiple Access (CDMA) system, a Frequency Division Multiple Access (FDMA) system, a Global System for Mobile Communications (GSM) system, a wireless local area network (WLAN) system, some other wireless system, or a combination of any of these. A CDMA system may implement Wideband CDMA (WCDMA), CDMA 1×, Evolution-Data Optimized (EVDO), Time Division Synchronous CDMA (TD-SCDMA), or some other version of CDMA. Each or any of the above systems may be generically referred to herein with the label "wireless communications protocol" or a "wireless communications technology."

The wireless communication system 100 may provide communication for a number of cells 102, each of which may be serviced by a base station 130 and 132 or other communication network component. The base stations 130 and 132 may alternatively be referred to as access points, Node Bs, or some other terminology. For simplicity, FIG. 1 shows wireless communication system 100 including two base stations 130 and 132. In general, a wireless communication 100 system may include any number of base stations 130, 132 and any set of network entities.

FIG. 1 depicts a single PCD/wireless device 110 connected to the system. The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a wireless local loop (WLL) station, a Bluetooth device, etc. Although only one wireless device 110 is illustrated in FIG. 1 for simplicity's sake, there may be multiple wireless devices connected to the communication system 100, including multiple wireless devices 110 connected to each base station 130 and 132. Moreover, wireless devices 110 may be fixed (i.e. stationary) or mobile, such as a wireless device 110 located in or affixed to a vehicle.

Wireless device(s) 110 may communicate with wireless communication system 100 using a variety of algorithms and methods. Wireless device 110 may also receive signals from broadcast stations (e.g., a broadcast station 134), signals from satellites (e.g., a satellite 150) in one or more global navigation satellite systems (GNSS), etc. Wireless device 110 may support one or more wireless communications technologies for wireless communication such as LTE, WCDMA, CDMA 1×, FDMA, EVDO, TD-SCDMA, GSM, 802.11, etc. A communication link that facilitates transmission from a base station 130, 132 to a wireless device 110 may be referred to as a down link, and a communication link that facilitates transmission from a wireless device 110 to a base station 130, 132 may be referred to as an uplink.

Figure 2A:
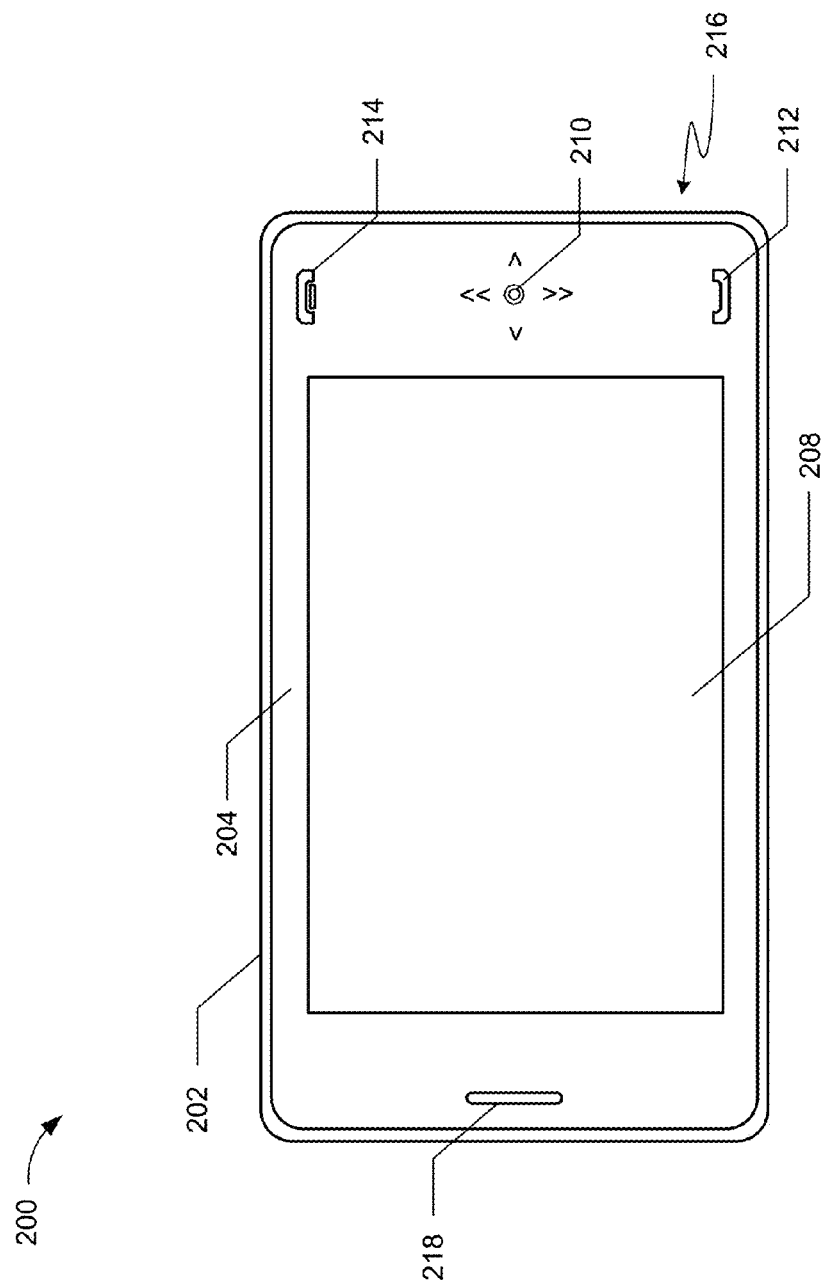
FIG. 2A is a schematic diagram illustrating an example embodiment of a PCD.
Figure 2B:
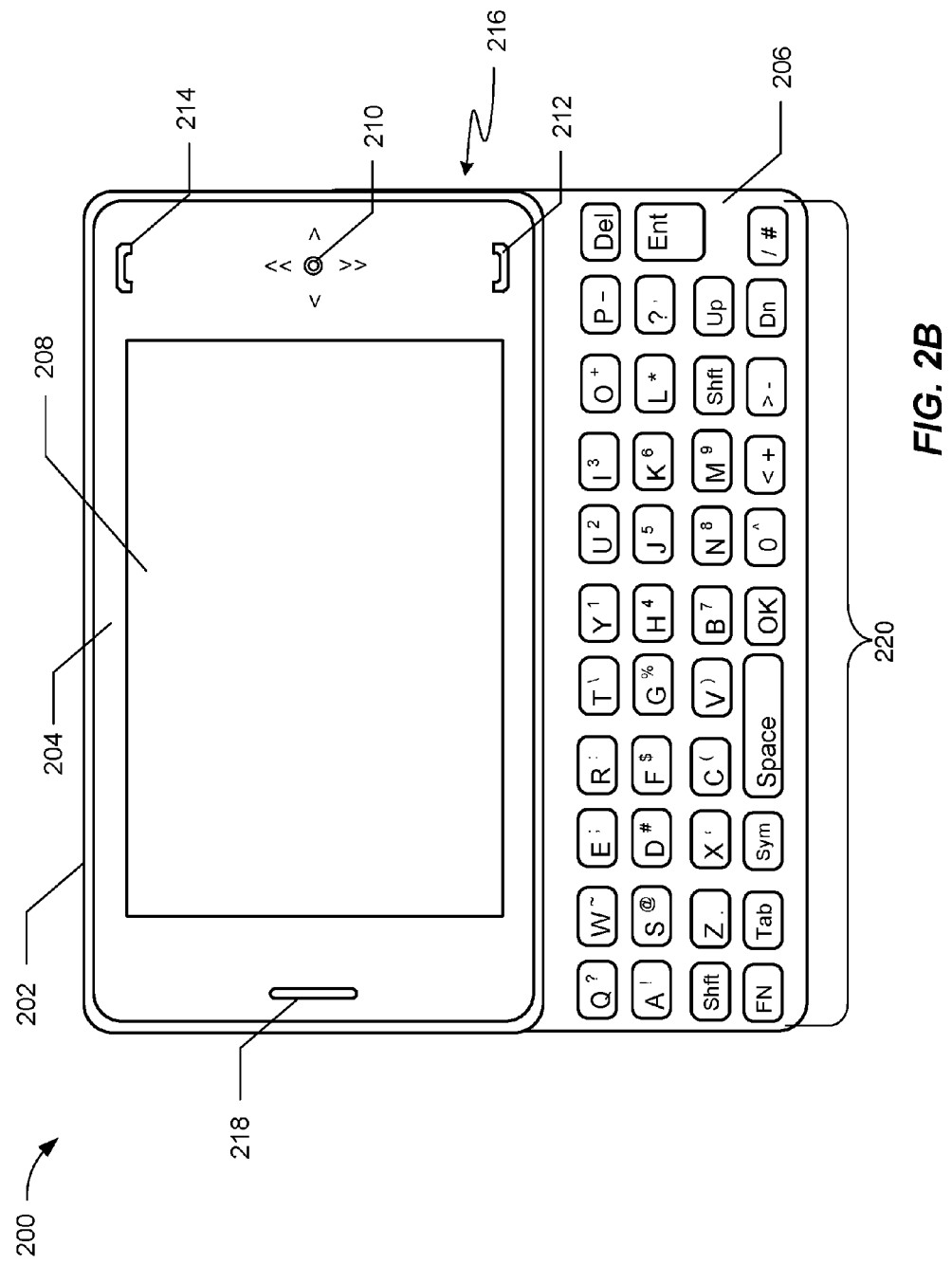
FIG. 2B is schematic diagram illustrating an example aspect of the PCD illustrated in FIG. 2A.

Referring to FIG. 2A and FIG. 2B, an exemplary PCD 200 that may be a wireless device 110 used within the wireless communication network 100 described in FIG. 1 is shown. The PCD 200 includes a housing 202. The housing 202 has an upper housing portion 204 and a lower housing portion 206. FIG. 2A shows that the upper housing portion 204 may include a display 208. In a particular aspect, the display 208 may be a touch screen display. The upper housing portion 204 may include a trackball input device 210. Further, as shown in FIG. 2A, the upper housing portion 204 includes a power on button 212 and a power off button 214, a speaker 218 and a microphone 216. In an alternative embodiment (not shown) a single pushbutton may be arranged to enable a power on mode and thereafter a power off mode. Additional pushbutton(s) may be provided to control operation of various subsystems arranged within the housing 202. For example, the PCD 200 may be arranged with a pushbutton (not shown) to answer a phone call communicated to the PCD by a cellular service provider.

In a particular aspect, as depicted in FIG. 2B, the upper housing portion 204 is movable relative to the lower housing portion 206. Specifically, the upper housing portion 204 may be slidable relative to the lower housing portion 206. As shown in FIG. 2B, the lower housing portion 206 includes a multi-button keyboard 220. In a particular aspect, the multi-button keyboard 220 may be a standard QWERTY keyboard. The multi-button keyboard 220 may be revealed when the upper housing portion 204 is moved relative to the lower housing portion 206.

Figure 3:
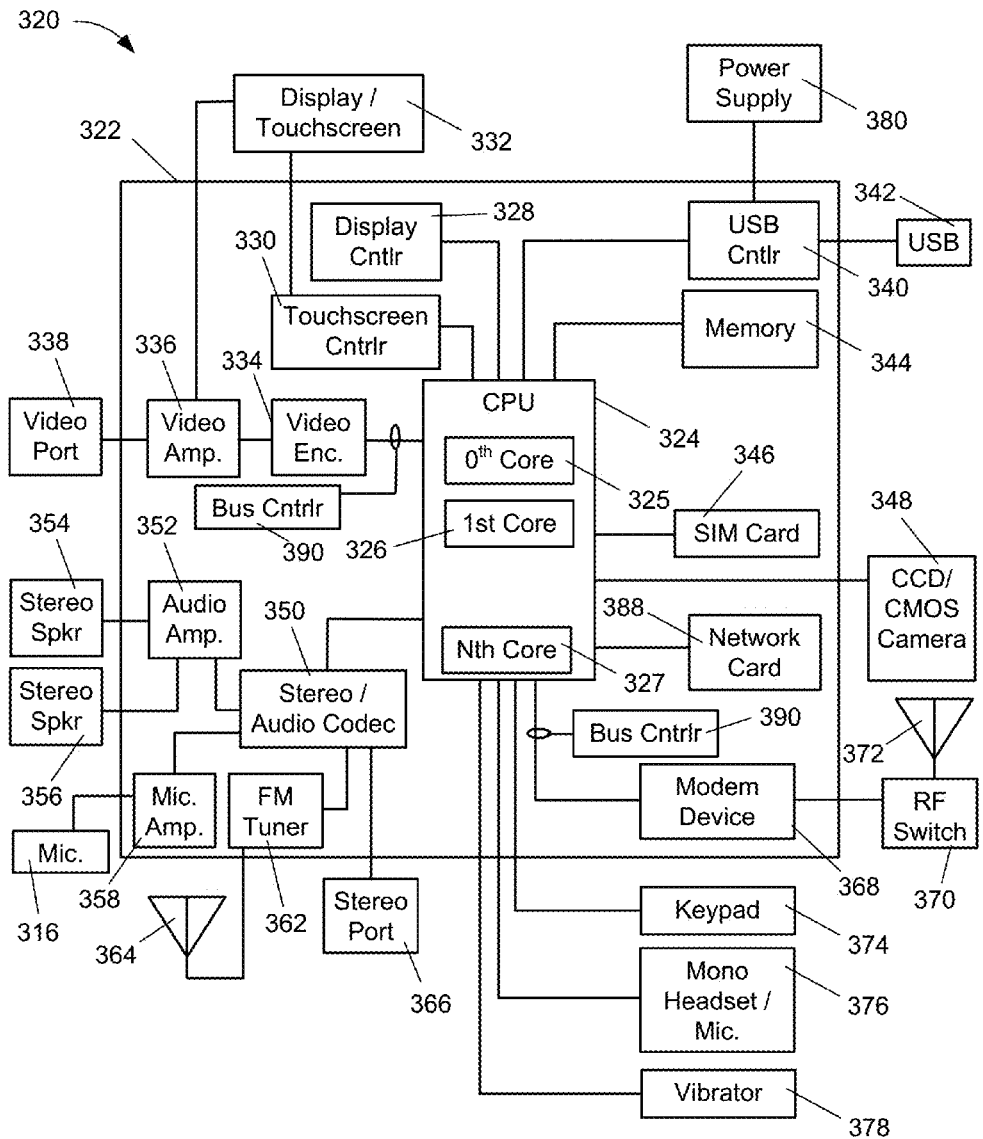
FIG. 3 is a block diagram of a second example aspect of the PCD illustrated in FIG. 2.

Referring to FIG. 3, a block diagram of an exemplary, non-limiting aspect of a portable computing device (PCD) is shown and is generally designated 320. As shown, the PCD 320 includes an on-chip system 322 that includes a multicore CPU 324. The multicore CPU 324 includes a zeroth core 325, a $1^{st}$ or first core 326, and an $N^{th}$ core 327. Each of the cores 325, 326, 327 may control one or more function of the PCD 320. For example, the $1^{st}$ core 326 may be a graphics processing unit (GPU) for controlling graphics in the PCD 320. Such GPU/1st core 326 may further include drivers and/or other components necessary to control the graphics in the PCD 320, including controlling communications between the GPU core 326 and memory 344 (including buffers). For another example, a different core such as the Nth core 327 may control the camera 348 and such core 327 may further include drivers and/or other components necessary to control the camera 348, including communications between the core 327 and memory 344 (including buffers).

As illustrated in FIG. 3, a display controller 328 and a touch screen controller 330 are coupled to the multicore CPU 324. In turn, display/touchscreen 332, external to the on-chip system 322, is coupled to the display controller 328 and the touch screen controller 330.

FIG. 3 further indicates that a video encoder 334, e.g., a phase alternating line (PAL) encoder, a sequential couleur a memoire (SECAM) encoder, or a national television system(s) committee (NTSC) encoder, is coupled to the multicore CPU 324. Further, a video amplifier 336 is coupled to the video encoder 334 and the display/touchscreen 332. Also, a video port 338 is coupled to the video amplifier 336. As depicted in FIG. 3, a universal serial bus (USB) controller 340 is coupled to the multicore CPU 324. Also, a USB port 342 is coupled to the USB controller 340. A memory 344 and a subscriber identity module (SIM) card 346 may also be coupled to the multicore CPU 324. In other embodiments, multiple SIM cards 346 may be implemented.

Further, as shown in FIG. 3, a digital camera 348 may be coupled to the multicore CPU 324. As discussed above, in such embodiments, the digital camera 348 may be controlled by one of the cores of the multicore CPU 324. In an exemplary aspect, the digital camera 348 is a charge-coupled device (CCD) camera or a complementary metal-oxide semiconductor (CMOS) camera. As further illustrated in FIG. 3, a stereo audio CODEC 350 may be coupled to the multicore CPU 324. Moreover, an audio amplifier 352 may be coupled to the stereo audio CODEC 350. In an exemplary aspect, a first stereo speaker 354 and a second stereo speaker 356 are coupled to the audio amplifier 352.

FIG. 3 shows that a microphone amplifier 358 may be also coupled to the stereo audio CODEC 350. Additionally, a microphone 316 may be coupled to the microphone amplifier 358. In a particular aspect, a frequency modulation (FM) radio tuner 362 may be coupled to the stereo audio CODEC 350. Also, a FM antenna 364 is coupled to the FM radio tuner 362. Further, a stereo port 366 may be coupled to the stereo audio CODEC 350.

FIG. 3 further indicates that a modem device 368 may be coupled to the multicore CPU 324. The modem device 368 may support one or more of the wireless communications protocols, such as GSM, CDMA, W-CDMA, TDSCDMA, LTE, and variations of LTE such as, but not limited to, FDB/LTE and PDD/LTE wireless protocols. Additionally, there may be multiple modem devices 368, and in such embodiments, different modem devices 368 may support some or all of the wireless communication protocols and/or technologies listed above.

The modem device 368 may be further comprised of various components, including a separate processor, memory, and/or a radio frequency (RF) transceiver. Further, the modem device 368 may be incorporated in an integrated circuit. That is, the components comprising the modem device 368 may be a full solution in a chip. Additionally, various components comprising the modem device 368 may also be coupled to the multicore CPU 324. An RF switch 370 may be coupled to the modem device 368 and an RF antenna 372. In various embodiments, there may be multiple RF antennas 372, and each such RF antenna 372 may be coupled to the modem device through an RF switch 370.

As shown in FIG. 3, a keypad 374 is coupled to the multicore CPU 324. Also, a mono headset with a microphone 376 may be coupled to the multicore CPU 324. Further, a vibrator device 378 may be coupled to the multicore CPU 324. FIG. 3 also shows that a power supply 380 may be coupled to the on-chip system 322 via the USB controller 340. In a particular aspect, the power supply 380 is a direct current (DC) power supply that provides power to the various components of the PCD 320 that require power. Further, in a particular aspect, the power supply is a rechargeable DC battery or a DC power supply that is derived from an alternating current (AC) to DC transformer that is connected to an AC power source.

FIG. 3 further indicates that the PCD 320 may also include a network card 388 that may be used to access a data network, e.g., a local area network, a personal area network, or any other network. The network card 388 may be a Bluetooth network card, a WiFi network card, a personal area network (PAN) card, or any other network card well known in the art. Further, the network card 388 may be incorporated in an integrated circuit. That is, the network card 388 may be a full solution in a chip, and may not be a separate network card 388.

As depicted in FIG. 3, the display/touchscreen 332, the video port 338, the USB port 342, the camera 348, the first stereo speaker 354, the second stereo speaker 356, the microphone 316, the FM antenna 364, the stereo port 366, the RF switch 370, the RF antenna 372, the keypad 374, the mono headset 376, the vibrator 378, and the power supply 380 are external to the on-chip system 322.

As further indicated in FIG. 3, two instances of a bus controller 390 are provided. The first instance of the bus controller 390 is responsive to signals in the bus interface that communicatively couples the CPU 324 to components of a multimedia subsystem, including the video encoder 334. While only two instanced of the bus controller 390 are depicted in FIG. 3, it should be understood that any number of similarly configured bus controllers 390 can be arranged to monitor a bus interface arranged in the on-chip system 322. Alternatively, a single bus controller could be configured with inputs arranged to monitor two or more bus interfaces that communicate signals between CPU 324 and various subsystems of the PCD 320 as may be desired.

In a particular aspect, one or more of the method steps described herein may be enabled via a combination of data and processor instructions stored in the memory 344. These instructions may be executed by one or more cores in the multicore CPU 324 in order to perform the methods described herein. Further, the multicore CPU 324, the memory 344, multimedia subsystem (including the video encoder 334), the camera 348, or a combination thereof may serve as a means for executing one or more of the method steps described herein in order enable dynamic and adaptive compression mode selection for memory buffers.

Figure 4:
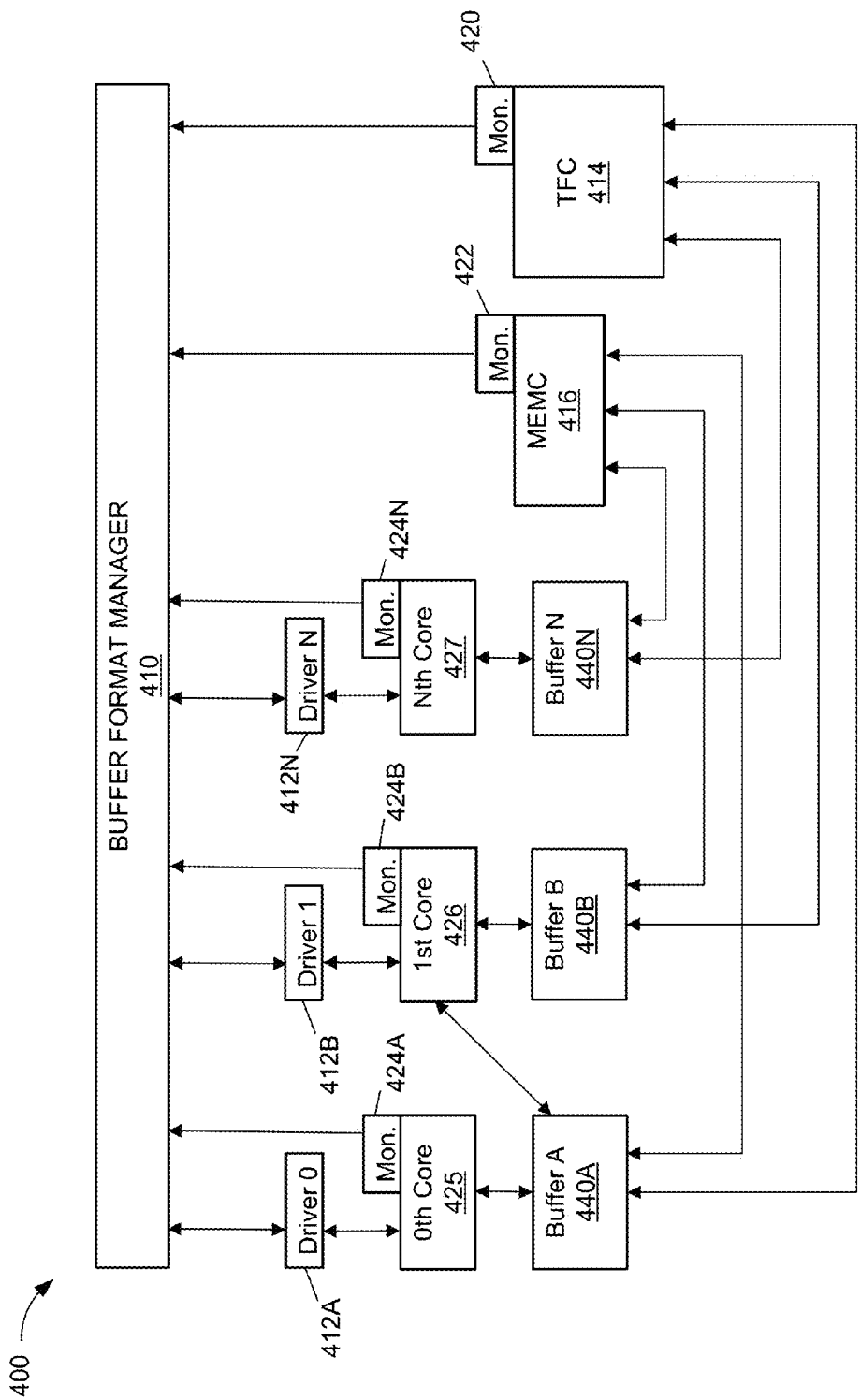
FIG. 4 is a block diagram showing an exemplary system allowing for dynamic and adaptive compression mode selection for memory buffers for the PCD illustrated in FIG. 3.

FIG. 4 is an illustration of an embodiment of an aspect of the PCD 320 illustrated in FIG. 3 that allows for dynamic and adaptive compression mode selection for memory buffers. In the illustrated embodiment, the adaptive buffer control system 400 may include a buffer format manager 410 in communication with one or more cores 425, 426, 427 through their respective drivers 412A, 412B, 412N. The buffer format manager 410 may be implemented as hardware or as software such as programming or executable code. When implemented as software, the programming or executable code may be stored in a processor readable medium (e.g., in an external memory device or and internal memory device) and may use algorithms, tables, or other methods to execute its functions and decision-making described below. The buffer format manager 410 may reside on the same integrated circuit (IC) as one or more of the cores 425, 426, 427, or the buffer format manager 410 may reside on a separate IC.

Each driver 412A, 412B, 412N may be implemented in software as desired and may be used to control or operate one of the cores 425, 426, 427. While each core 425, 426, 427 is illustrated as having a separate driver 412A, 412B, 412N, in other implementations, a single driver 412A may operate to drive more than one core 425, 426, 427 without departing from the present invention. Similarly, in the illustrated embodiment, a $0^{th}$ core 425, $1^{st}$ core 426 and Nth core 427 are shown depicted. As would be understood, the Nth core 427 could be any number desired, and more than the three cores depicted in FIG. 4 could be implemented. Each core 425, 426, 427 in FIG. 4 may be implemented on different ICs, or one or more of the cores 425, 426, 427 may reside on the same IC.

As shown in FIG. 4, each core 425, 426, 427 is in communication with at least one buffer 440A, 440B, 440N such that the core 425, 426, 427 may read and/or write data into the buffer 440A, 440B, 440N. Each buffer 440A, 440B, 440N, may be any type of memory desired, such as dynamic random access memory (DRAM), including double data rate (DDR) type memory. Additionally, while core 425 is shown as being in communication with one buffer 440A in FIG. 4, it will be understood that each core 425, 426, 427 may be in communication with any desired number of buffers 440A, 440B, 440N as desired or as needed.

In some embodiments, the buffers 440A, 440B, 440N may be dedicated buffers such as for example, buffers used for only certain functionality of the PCD 320 or used to hold one type of data. One example could be that the buffers 440A, 440B, 440N are multimedia buffers accessed only by components or cores of a multimedia subsystem of the PCD 320 such as a camera core, video encoder core, GPU core, etc.

In other embodiments, the buffers 440A, 440B, 440N may instead be general purpose and/or may be accessed by other functionality or cores of the PCD 320, such as a modem subsystem or core. Additionally, while shown as physically separate in FIG. 4, one or more of the buffers 440A, 440B, 440N may be physically collocated and/or may comprise different banks or portions of the same physical memory. Additionally, while typically only one core 425 (for example) will write to a specific buffer 440A (for example) at a time, multiple cores 425 and 426 may read from the same buffer 440A as desired or as needed.

The system 400 may also include a memory controller (MEMC) 416 to manage the flow of data going to and from one or more of the buffers 440A, 440B, 440N. Additionally, the system 400 may include a transparent format converter (TFC) 414 for decoding or decompressing data retrieved from one or more of the buffers 440A, 440B, 440N as needed or required. The TFC may be implemented in hardware or software, and may use any desired methods or algorithms to accomplish the decoding/decompressing as required by the system requirements of the PCD 320 and/or the requirements of any applications running on the PCD 320.

The system 400 will also include various monitors 420, 422, 424 in communication with the buffer format manager 410. In the illustrated embodiment a TFC monitor 420 is implemented at the TFC 414 to monitor the activity of the TFC 414 as discussed below and to provide information about the TFC 414 operation to the buffer format manager 410. In some embodiments, the TFC monitor 420 may be a counter implemented in hardware or software. In other embodiments, the TFC monitor 420 may monitor and provide various information to the buffer format manager 410, such as from which buffer 440A, 440B, 440N the TFC monitor 420 has been retrieving data, how often data has been retrieved, which application(s), component(s), or core(s) have been retrieving data from one or more buffers 440A, 440B, 440N, whether all of the data in a buffer 400A, 440B, 440N has been retrieved or only a part of the data, how many times data has been retrieved, whether the data retrieval has been random access, etc.

The system 400 may also include an MEMC monitor 422 at the MEMC 416 to monitor the activity of the MEMC 416, and to provide information about the MEMC 416 operation to the buffer format manager 410. Similar to the TFC monitor 420, the MEMC monitor 422 may be a counter implemented in software or hardware, or may monitor and provide various information to the buffer format manager 410 relating to the buffers 440A, 440B, 440N and/or the which application(s), component(s), or core(s) that may be accessing one or more of the buffers 440A, 440B, 440N.

Some embodiments may also use core monitors 424A, 424B, 424N at each of the cores 425, 526, 427. The core monitors 424A, 424B, 424N are in communication with the buffer format manager 410 and may serve to provide similar information to the buffer format manager 410 as the TFC monitor 420 and MEMC monitor 422 discussed above. The embodiment illustrated in FIG. 4 includes a TFC monitor 420, an MEMC monitor 422, as well as core monitors 424A, 424B, 424N. In other embodiments, one or more of these monitors may be omitted as desired.

The buffer format manager 410 in the embodiment illustrated in FIG. 4 operates to provide adaptive mode selection for one or more of the buffers 440A, 440B, 440N. Rather than making the selection or determination of how to store data in a particular buffer (440A for example) in a decentralized manner based on the application/or core storing the data in the buffer 440A (the $0^{th}$ core 425 for example), the buffer format manager 410 allows for centralized and adaptive selection(s) or determination(s) of how to format and/or store data in the buffers 440A, 440B, 440N based on how data stored in the buffers 440A, 440B, 440N is being accessed by components/applications/cores.

By way of example, the buffers 440A, 440B, 440N in FIG. 4 may be multimedia buffers for storing image pixel data. Such image pixel data may be generated by the $0^{th}$ core 425 (a camera in this example), the $1^{st}$ core 426 (a GPU in this example), the Nth core 427 (a video encoder/decoder in this example), or a software application (not shown) illustrated in FIG. 4. Each of the cores 425, 426, 427 may then store the pixels into one or more of the buffers 440A, 440B, 440N. Since these are multimedia buffers in the present example, it may be possible to store the pixels in each of the buffers 440A, 440B, 440N in various formats such as: linear uncompressed, tiled uncompressed, tiled compressed—index free, or tiled compressed—indexed.

For some buffers, the pixel data may be stored in a linear uncompressed format using any buffer protocol. Additionally, the pixel data may be stored in a "tiled" format in order to help improve the buffer bandwidth. In a "tiled" format, the buffer is organized into tiles of a pre-determined geometric shape and size, where each tile includes a set of pixels. The size and shape of the tiles may vary from buffer to buffer and may depend on the type of pixel data—for example one tile shape/size may be used for a buffer if the pixel data is in a red-green-blue (RGB) form, while a different tile shape/size may be used for a buffer if the pixel data is in luma/chrominance (such as YUV, YPbPr, or YCbCr) form.

After tiling, in the present example the pixel data stored in the buffer may also be encoded or compressed if desired to further improve buffer bandwidth and/or reduce the amount of buffer space needed to store the pixel data (reduce the memory footprint). Such encoding or compression may be accomplished using lossy or lossless compression as desired, implemented by any appropriate encoding or compression system, method, or algorithm.

In one exemplary format—indexed compression—the pixel data is compressed and then stored contiguously in the memory along with an index from which the location of each tile may be determined. Indexed compression can help reduce or optimize both bandwidth and memory footprint, but makes it more difficult for each tile in the buffer to be randomly accessed. In another exemplary format—index free compression—the pixel data is compressed and then stored starting with the same address location as it would have been if the data were not compressed. Index free compression can help reduce or optimize bandwidth, but does not reduce the memory footprint. However, index free compression allows for easier random access of each tile in the buffer, allowing for more efficient and faster operation of components, software, cores, etc. that attempt to access the tiles randomly.

Figure 5B:
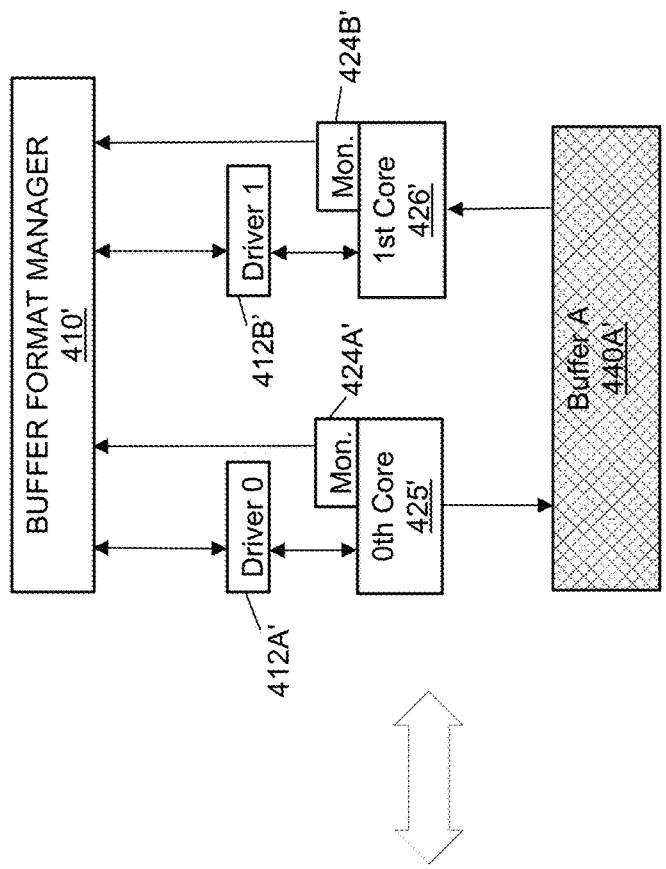
FIG. 5B is a block diagram showing another exemplary operation of the aspect illustrated in FIG. 5A.
Figure 5A:
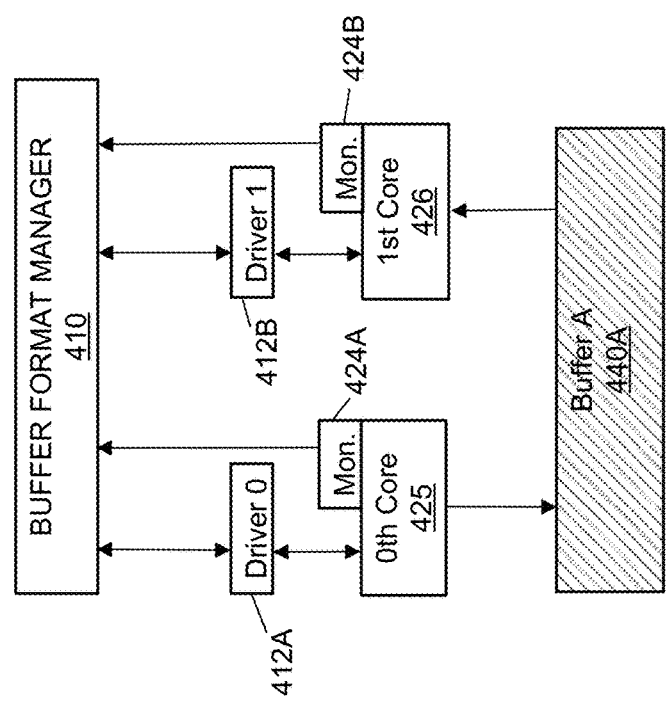
FIG. 5A is a block diagram showing an exemplary operation of an aspect of the system illustrated in FIG. 4.

FIGS. 5A and 5B illustrate one example of adaptively changing the format of a buffer, continuing the example of a multimedia buffer. FIGS. 5A and 5B depict an aspect of the system 400 illustrated in FIG. 4. In the embodiment of FIG. 5A, the buffer format manager 410 may initially determine that the appropriate format for the pixel data being stored in buffer 440A is tiled—compressed indexed in order to reduce both bandwidth and memory footprint. In various embodiments, the buffer format manager 410 may make this initial determination based on a variety of factors, including the current conditions of the PCD 320, the use for which the PCD 320 is intended, or as a default. The buffer format manager 410 communicates with the appropriate driver, $0^{th}$ driver 412A in this example, which will format the buffer 440A as tiled, and will ensure that the pixel data placed into the buffer 440A is compressed indexed, as illustrated by the diagonal hatching in buffer 440A of FIG. 5A.

If the buffer 440A is being accessed by software, components, or cores of the PCD 320, the buffer format manager 410 will receive communications from one or more of the monitors 420, 422, 424, depending on the circumstances and/or what is accessing the buffer 440A. Based on the information received about the access to the buffer 440A, the buffer format manager 410 may decide to change the format of the buffer 440A. In the embodiment illustrated in FIG. 5A, the 1st core 426 (a GPU in this example) is randomly accessing pixel tiles in the buffer 440A. The buffer format manager 410 will receive communications from one or more monitors such as the TFC monitor 420 (see FIG. 4) or the monitor 424B relating to such access.

The buffer format manager 410 may determine that the nature and/or number of accesses to the buffer 440A by the GPU/$1^{st}$ core 426 warrant a format change to tiled—compressed index free in order to allow for easier random access and facilitate the operation of the GPU/1st core 426. In this event, as illustrated in FIG. 5B, the buffer format manager 410' communicates with the appropriate driver, $0^{th}$ driver 412A' in this example, which will appropriately re-format the buffer 440A' such that the pixel data stored in the buffer 440A' going forward is tiled—compressed index free as represented by the cross hatching in buffer 440A' of FIG. 5B.

As illustrated in FIG. 5B, the buffer format manager 410' will then continue to receive information from monitors such as the TFC monitor 420 (see FIG. 4) and/or the monitor 424B' about any continuing access of the buffer 440A' by the GPU/1st core 426' (or access by other components, software, or cores) in order to determine whether any additional format changes to buffer 440A' may be warranted. For example, if the buffer format manager 410' receives information that the GPU/1st core 426' is no longer randomly accessing data from buffer 440A' the buffer format manager 410' may determine that the lack of access warrants a format change for buffer 440A' to tiled—compressed indexed in order to optimize both bandwidth and memory footprint.

In that event, as illustrated in FIG. 5A, the buffer format manager 410 communicates with the appropriate driver, $0^{th}$ driver 412A in this example. The $0^{th}$ driver 412A will appropriately format the buffer 440A such that pixel data stored in buffer 440A going forward is tiled—compressed indexed as illustrated by the diagonal hatching in FIG. 5A.

FIGS. 6A and 6B illustrate another example of adaptively changing the format of a buffer, continuing the example of a multimedia buffer. FIGS. 6A and 6B depict another aspect of the system 400 illustrated in FIG. 4. In the embodiment of FIG. 6A, the buffer format manager 410 may determine that the appropriate initial format for the pixel data being stored in buffer 440A is tiled—compressed indexed in order to reduce both bandwidth and memory footprint. In various embodiments, the buffer format manager 410 may make this initial determination based on a variety of factors, including the current conditions of the PCD 320, the use for which the PCD 320 is intended, or as a default. The buffer format manager 410 communicates with the appropriate driver, $0^{th}$ driver 412A in this example, which will appropriately format the buffer 440A to tiled. The $0^{th}$ driver 412A also ensures that all pixel data being stored in the buffer 440A is compressed indexed, as illustrated by the diagonal hatching in FIG. 6A.

If the buffer 440A is accessed by software, components, or cores of the PCD 320, the buffer format manager 410 will receive communications about such access from one or more of the monitors 420, 422, 424, depending on the circumstances and/or what accesses the buffer 440A. Based on the information received about the access to the buffer 440A, the buffer format manager 410 may decide to change the format of the buffer 440A. In the embodiment illustrated in FIG. 6A, a software application 460 accesses the buffer 440A via the TFC 414.

In this example, the software application 460 may require that the pixel data be provided in an uncompressed format. Accordingly, the TFC 414 retrieves the pixel data from the buffer 440A, decompresses/unencodes the pixel data, and provides the pixel data to the software application 460. In other embodiments it may not be necessary that the TFC 414 provide uncompressed pixel data to the software application 460, and the TFC 414 can provide the pixel data to the software application 460 in whatever format the software application 460 requires.

The buffer format manager 410 will receive communications from one or more monitors such as the TFC monitor 420 relating to the software application's 460 access of buffer 440A. Exemplary information from the TFC monitor 420 could include the number of times the software application 460 accessed the buffer 440A, whether the software application 460 is accessing all of the pixel data stored in the buffer 440A or only some of the pixel data, whether the software application 460 is randomly accessing the pixel data in the buffer 440A, etc.

Based on the information received, the buffer format manager 410 in FIG. 6A may determine that the nature and/or number of accesses by the software application 460 warrant a format change to linear uncompressed to facilitate the operation of the software application 460. In that event, as illustrated in FIG. 6B, the buffer format manager 410' communicates with the appropriate driver, $0^{th}$ driver 412A' in this example, which will appropriately re-format buffer 440A' to store the pixel data linearly, and will ensure that the pixel data stored in the buffer 440A' going forward is uncompressed as represented by the lack of any hatching in FIG. 6B.

As illustrated in FIG. 6B, the buffer format manager 410' will then continue to receive information from monitors such as the TFC monitor 420' about any continuing access to the buffer 440A' by the software application 460' (or access by other components, software, or cores) in order to determine whether additional format changes to buffer 440A' may be warranted. For example, if the buffer format manager 410' receives information from the TFC monitor 420' that the software application 460' no longer accesses data from buffer 440A', the buffer format manager 410' may determine that the lack of access warrants a format change for buffer 440A' to tiled—compressed indexed in order to again reduce both bandwidth and memory footprint.

In that event, as illustrated in FIG. 6A, the buffer format manager 410 communicates with the appropriate driver, $0^{th}$ driver 412A in this example. The $0^{th}$ driver 412A will appropriately format buffer 440A to store the pixel data in a tiled format. Additionally, the 0th driver 412A will ensure that pixel data stored in buffer 440A going forward is compressed indexed as illustrated by the diagonal hatching in FIG. 6A.

Although discussed in terms of multimedia buffers in the examples above, the present invention is not limited to multimedia, and is equally applicable to buffers for other portions or functions of the PCD 320, such as modem buffers. Additionally, the above illustrations in FIGS. 5A-5B and 6A-6B are nonlimiting examples of the operation of the system 400 of FIG. 4. Other operations are possible, and are within the scope of the invention. For example, although not shown in FIGS. 5A-5B or 6A-6B, it is anticipated that a core 425, 426, 427 may accesses a buffer 440A, 440B, 440N into which data is being written by a software application 460 (see FIG. 6A) or a non-multimedia core.

It is also anticipated that in some embodiments more than one buffer 440A, 440B, 440N may be accessed by a core 425, 426, 427 or by a software application 460 (see FIG. 6A). In such embodiments, the buffer format manager 410 may make a separate determination for each of the buffers accessed, which may lead to different actions/formats being determined for the different buffers. Conversely, it is anticipated that one buffer 440A may be accessed by both a core (such as GPU/$1^{st}$ core 426) and a software application 460, each with differing needs. In such implementations, the buffer format manager 410 may determine the appropriate format for the buffer 440A based on which of the core 426 or software application 460 is accessing the buffer 440A more often, which is accessing more of the data within the buffer 440A, or any other consideration (such as the planned use of the PCD 320 or optimizing bandwidth and/or memory footprint).

In yet other embodiments, the buffer format manager 410 may take a stepped or staged approach to deciding the format for a buffer 440A, 440B, 440N. For example, in the illustration of FIG. 6A, the buffer format manager 410 may receive information relating to access of buffer 440A by software application 460. However, the information provided by the TFC monitor 420 may indicate infrequent access to buffer 440A. The buffer format manager 410 may determine, such as based on threshold values, that the number of accesses of buffer 440A only warrants modifying the format of buffer 440A to tiled—uncompressed rather than linear—uncompressed. Subsequently, based on further information received, the buffer format manager 410 may determine that the software application 460 has increased the frequency of access to buffer 440A. In that event, the buffer format manager 410 may determine, such as based on another threshold value, to re-format buffer 440A to linear—uncompressed based on the increased access to buffer 440A by the software application 460.

It is also contemplated that in some embodiments one or more buffers 440A, 440B, 440N may be accessed in a chain by different components, cores or software. In the illustration of FIG. 6A, the software application 460 after receiving the pixel data from Buffer A 440A may then write the pixel data to a different buffer, such as Buffer B 440B (not shown in FIG. 6A). Buffer B 440B may then be accessed by a different application or core, such as GPU/$1^{st}$ core 426. In that event, the various monitors 420, 422, 424 may provide information to the buffer format manager 410, causing the buffer format manager 410 to make separate determinations as to the appropriate format for Buffer A 440A and Buffer B 440B, based on the differing access.

For example, the buffer format manager 410 may decide that Buffer A 440A accessed by software application 460 should be formatted as linear—uncompressed. At the same time, the buffer format manager 410 may decide that Buffer B 440B which receives data from the software application 460 and which is accessed by the GPU/$1^{st}$ core 426 should be formatted as tiled—compressed index free. Thus, the same pixel data may be stored as uncompressed in one buffer 440A, but may be tiled and/or compressed in a different buffer 440B. This may result based on which components, software, or cores are accessing the different buffers 440A and 440B, the frequency of access, the amount of data accessed, the needs to optimize bandwidth and/or memory footprint, etc.

By dynamically and adaptively selecting compression mode for one or more memory buffer, the system 400 and method 700 (see FIG. 7A) allow for continual optimization of the bandwidth, memory footprint, and/or operation of the components, cores, software, or applications making use of the data stored in the buffer. The buffer format manager 410 may be configured to consider and/or to give varying priorities to factors such as bandwidth optimization, memory footprint optimization, optimizing operation of the component(s), core(s), software, or application(s) accessing the data in a buffer, the intended use of the PCD, the PCD architecture, the size and number of the buffers available, whether the available buffers are shared with other processors of the PCD performing other functions, a battery level of the PCD, power consumption of the PCD, thermal conditions of the PCD, etc., when making the compression mode selection/determination at a given time for a particular buffer.

The compression mode selection or determination may be made by one or more algorithms, giving weight to any desired factor or optimization outcome, as well as by other methods, such as a look-up table. The compression mode selection or determination for one or more memory buffer may also be adaptively changed to reflect new conditions, allowing for improved and/or more precise optimization. Although described in terms of multimedia buffers in a PCD 320 herein for ease of understanding, the principles of system 400 and method 700 are equally applicable to other types of memory buffers, such as buffers used by a modem subsystem in a PCD 320.

Figure 7A:
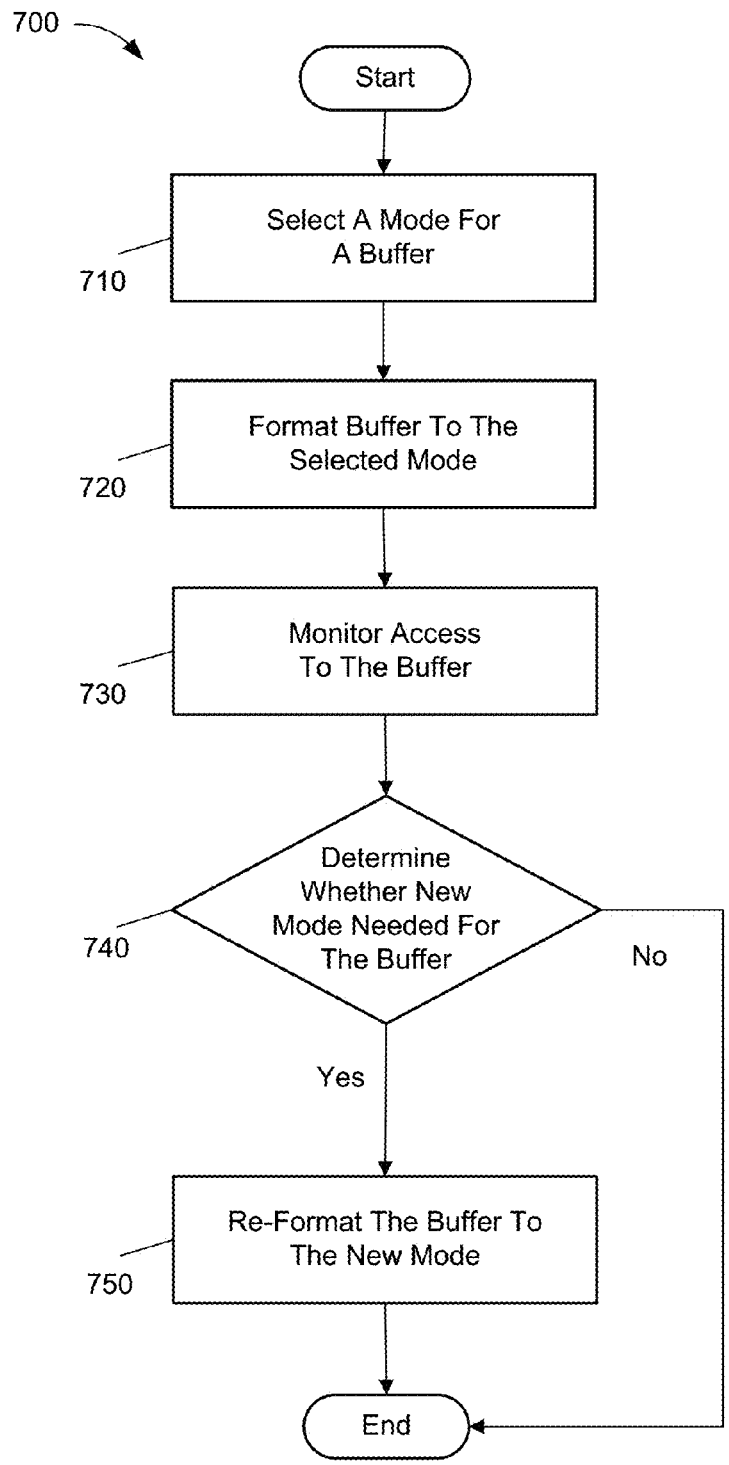
FIG. 7A is a flowchart describing an exemplary embodiment of a method for dynamic and adaptive compression mode selection for memory buffers in a PCD.

FIG. 7A is a flowchart describing an exemplary embodiment of a method for dynamic and adaptive compression mode selection for memory buffers, such as buffers used in or with a PCD 320. The method 700 begins with block 710 where a mode for a buffer is selected. As discussed, above the buffer may be any type of memory, including dynamic random access memory. Although discussed in FIG. 7A in terms of one buffer for convenience, the method 700 of 7A is equally applicable to multiple buffers. For embodiments with multiple buffers, block 710 may separately select a mode for each of the multiple buffers.

As indicated above, the mode selected may also select or determine how the buffer will store data, whether or not data within the buffer will be compressed and/or how the data to be stored within the buffer is compressed. Using the example of a multimedia buffer storing pixel data, the selection of the mode for the buffer may mean selecting or determining whether the buffer will store data linearly, or whether the buffer will be tiled. The selection of the mode for the buffer in step 710 may also include selecting or determining whether the pixel data in a tiled buffer, for example, will be compressed and/or what type of compression will be performed on the data, such as indexed compression or index free compression.

The selection may comprise one selection or determination of the mode for a buffer (such as tiled—compressed indexed), or may comprise two or more separate selections or determinations of whether or not to tile the buffer, and if tiled, whether or not to compress the data to be stored in the buffer. In some embodiments one component or element may make the selection(s) or determination(s), such as the buffer format manager 410 (FIG. 4).

In other embodiments, the selection process may be split among multiple elements. By way of example, one component such as the buffer format manager 410 may make a first selection or determination of whether or not to tile a buffer. Then the buffer format manager 410 may make a second selection or determination as to whether to compress the data indexed or indexed free. Finally, the buffer format manager 410 may communicate with another element such as the TFC 414 or the driver associated with the particular buffer. The particular methods or algorithms to use to achieve the compression of the data to be stored in the buffer may be selected or determined by TFC and/or the driver, or another element in communication with TFC or driver. In other implementations, the buffer format manager 410 may make the first selection or determination whether to tile the buffer from the example above, and then the TFC 414 or driver associated with the buffer may make the second and third selections or determinations, i.e. whether to compress and how to compress.

Additionally, the selection or determination in block 710 may be made by hardware or software using an algorithm, look-up table, or any other desired means taking into account a variety of factors, such as optimizing bandwidth, optimizing memory footprint, quality of service, power savings in the PCD 320, etc. Moreover, in some embodiments the initial selection could be a default setting such that for every initialization of a buffer a particular mode is selected as the default. In such embodiments, the default setting may be based on the type of buffer, the particular core or driver managing the buffer, or other considerations.

In block 720 the buffer is formatted to the selected mode. In some implementations, this formatting is performed by the driver associated with the buffer, while in other implementations other elements could perform the formatting. a determination is made whether there is a change of the modem state. As noted above, the method 700 of 7A is equally applicable to multiple buffers. For embodiments with multiple buffers, at block 720 each of the multiple buffers will be formatted to the mode selected for that individual buffer.

Block 730 monitors the access to the buffer that has been formatted. Again, for embodiments with multiple buffers, at block 730, each of the multiple buffers will be monitored. In some implementations a single monitor may monitor all of the multiple buffers, while in other implementations multiple monitors will act to monitor the multiple buffers.

As discussed above, this monitoring may be performed by one or more hardware or software monitors in communication with the buffer format manager 410, such as the TFC monitor 420, the MEMC monitor 422, or the core monitors 424A, 424B, 424N, or a combination of monitors. These monitors may provide various information to the buffer format manager 410 as desired, including which component, software application, or core(s) is/are accessing the buffer, how often each is accessing the buffer, the type of access to the buffer (such as random access or linear access), how much data within the buffer is being accessed, etc.

In block 740 a determination is made whether a new mode is needed for the buffer. This determination of block 740 is based at least in part on at least some of the monitor information provided to the buffer format manager 410; however, other considerations may impact this determination. As with block 710, the determination in block 740 may also select or determine how the buffer will store data, whether or not data within the buffer will be compressed and/or how the data to be stored within the buffer is compressed. The new compression mode determined in block 740 may be different from the compression mode selected in 710. Additionally, for embodiments with multiple buffers, the determination at block 740 is made for each of the multiple buffers, and each determination is made based on the monitored access to the respective one of the multiple buffers.

Continuing the example of a multimedia buffer storing pixel data, the determination in block 740 may include selecting or determining whether the buffer will be formatted to store data linearly or whether the buffer will be tiled. The determination in block 740 may also include selecting or determining whether the pixel data in a tiled buffer, for example, will be compressed and/or what type of compression will be performed on the data, such as indexed compression or index free compression.

The block 740 determination may comprise one selection or determination of the mode for the buffer (such as tiled—compressed indexed), or may comprise two or more separate selections or determinations of whether or not to tile the buffer; and if tiled, whether or not to compress the data to be stored in the buffer; and if compressed, whether or not to index the data to be stored in the buffer. In some embodiments one component or element may make the various selection(s) or determination(s), such as the buffer format manager 410 (FIG. 4).

In other embodiments, the various selections may be split among multiple elements. By way of example, one component such as the buffer format manager 410 may make a first selection or determination of whether or not to tile a buffer. Then the buffer format manager 410 may make a second selection or determination as to whether to compress the data indexed or indexed free. Finally, the buffer format manager 410 may communicate with another element such as the TFC 414 or the driver associated with the particular buffer. The particular methods or algorithms to use to achieve the compression of the data to be stored in the buffer may be selected or determined by TFC and/or the driver, or another element in communication with TFC or driver. In other implementations, the buffer format manager 410 may make the first selection or determination whether to tile the buffer from the example above, and then the TFC 414 or driver associated with the buffer may make the second and third selections or determinations, i.e. whether to compress and how to compress.

Additionally, the selection or determination in block 740 may be made by hardware or software using an algorithm, look-up table, or any other desired means taking into account a variety of considerations, such as optimizing bandwidth, optimizing memory footprint, quality of service, power savings in the PCD 320, etc.

If the determination in block 740 is that the buffer does not need a new mode, the process 700 ends. In other embodiments, upon a determination that a new mode is not needed, the process 700 could return to block 730 and continue monitoring access to the buffer for a particular number of iterations of the process 700, for set time limit, or for as long as data is being written into the buffer.

If the determination in block 740 is that the buffer does need a new mode, the process 700 continues to block 750 where the buffer is re-formatted to the new mode. As with block 720, in some implementations, the re-formatting in block 750 is performed by the driver associated with the buffer, while in other implementations other elements could perform the formatting. After re-formatting, the process 700 ends. In other embodiments, after the re-formatting, the process 700 could return to block 730 and continue monitoring access to the buffer for a particular number of iterations of the process 700, for set time limit, or for as long as data is being written into the buffer.

FIG. 7A describes only one exemplary embodiment of a method for dynamic and adaptive compression mode selection for memory buffers, such as memory buffers used in or with a PCD 320. In other embodiments of the method 700, other blocks or steps may be added to the process 700, or blocks or steps shown in FIG. 7A may be combined or omitted. Such variations of the method 700 are within the scope of the disclosure.

Additionally, certain steps in the processes or process flows described in this specification naturally precede others for the invention to function as described. However, the invention is not limited to the order of the steps described if such order or sequence does not alter the functionality of the invention. That is, it is recognized that some steps may performed before, after, or in parallel (substantially simultaneously) with other steps without departing from the scope of the invention. In some instances, certain steps may be omitted or not performed without departing from the invention. Further, words such as "thereafter", "then", "next", "subsequently", etc. are not intended to limit the order of the steps. These words are simply used to guide the reader through the description of the exemplary method.

Figure 7B:
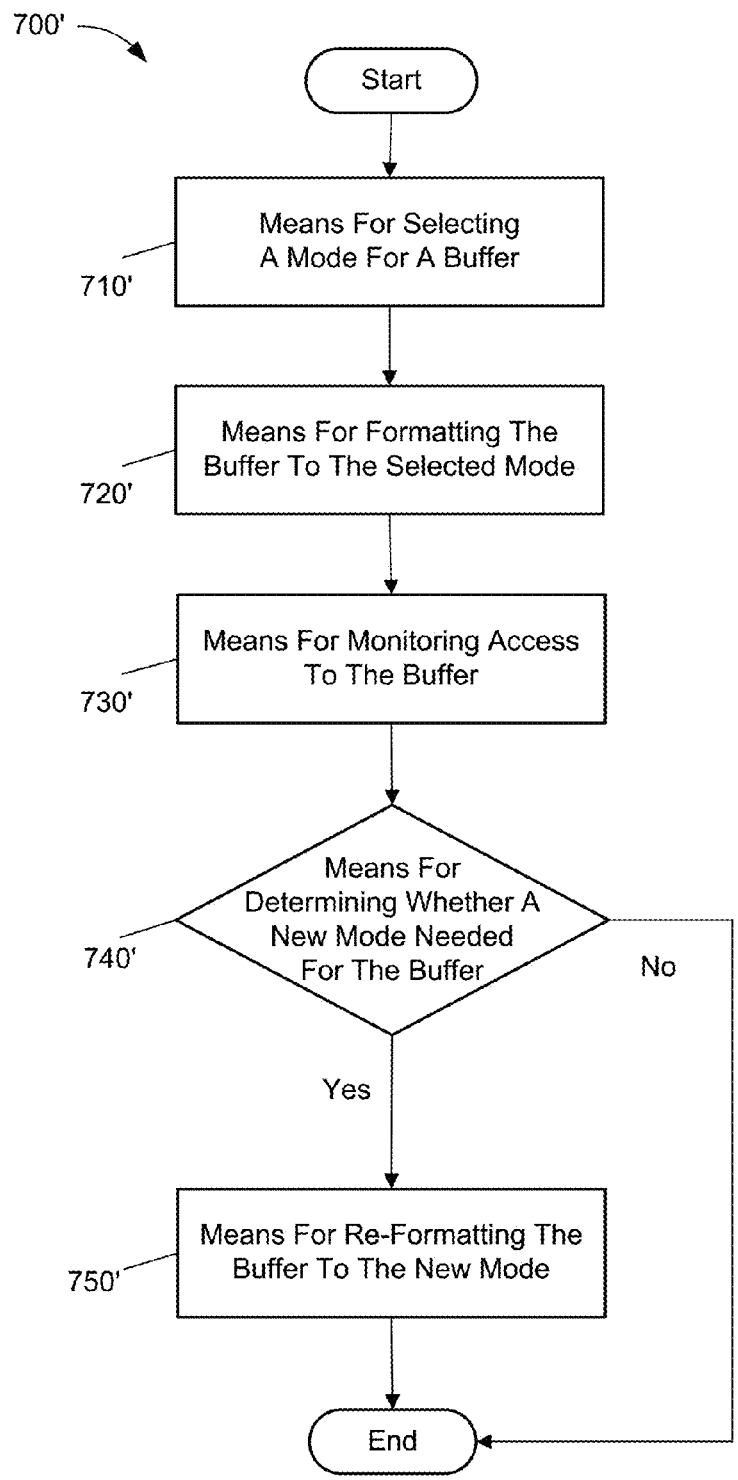
FIG. 7B illustrates example components capable of performing the method illustrated in FIG. 7A.

The various operations and/or methods described above may be performed by various hardware and/or software component(s) and/or module(s), and such component(s) and/or module(s) may provide the means to perform such operations and/or methods. Generally, where there are methods illustrated in Figures having corresponding counterpart means-plus-function Figures, the operation blocks correspond to means-plus-function blocks with similar numbering. For example, blocks 710-750 illustrated in FIG. 7A correspond to means-plus-function blocks 710'-750' illustrated in FIG. 7B.

Additionally, one of ordinary skill in programming is able to write computer code or identify appropriate hardware and/or circuits to implement the disclosed invention without difficulty based on the flow charts and associated description in this specification, for example. Therefore, disclosure of a particular set of program code instructions or detailed hardware devices is not considered necessary for an adequate understanding of how to make and use the invention. The inventive functionality of the claimed processor-enabled processes is explained in more detail in the above description and in conjunction with the drawings, which may illustrate various process flows.

In one or more exemplary aspects as indicated above, the functions described may be implemented in hardware, software, firmware, or any combination thereof. If implemented in software, the functions may be stored on or transmitted as one or more instructions or code on a computer-readable medium, such as a non-transitory processor-readable medium. Computer-readable media include both data storage media and communication media including any medium that facilitates transfer of a program from one location to another.

A storage media may be any available media that may be accessed by a computer or a processor. By way of example, and not limitation, such computer-readable media may comprise RAM, ROM, EEPROM, CD-ROM or other optical disk storage, magnetic disk storage or other magnetic storage devices, or any other medium that may be used to carry or store desired program code in the form of instructions or data structures and that may be accessed by a computer. Disk and disc, as used herein, includes compact disc ("CD"), laser disc, optical disc, digital versatile disc ("DVD"), floppy disk and blu-ray disc where disks usually reproduce data magnetically, while discs reproduce data optically with lasers. Combinations of the above should also be included within the scope of non-transitory computer-readable media.

Although selected aspects have been illustrated and described in detail, it will be understood that various substitutions and alterations may be made herein without departing from the present invention, as defined by the following claims.

What is claimed is:

1. A method for adaptive compression mode selection for memory buffers in a portable computing device (PCD), the method comprising:
    selecting a first compression mode for a buffer of the PCD;
    formatting the buffer to the first compression mode;
    monitoring an access to the buffer;
    selecting a second compression mode for the buffer based on the monitored access; and
    formatting the buffer to the second compression mode, wherein selecting a second compression mode for the buffer based on the monitored access further comprises:
    selecting whether a set of data stored in the buffer will be linear or tiled based on the monitored access; and
    selecting whether the set of data stored in the buffer will be compressed based on the monitored access;
    wherein the first compression mode is different from the second compression mode.

2. The method of claim 1, further comprising:
    monitoring a second access to the buffer;
    selecting a third compression mode for a buffer based on the second monitored access; and
    formatting the buffer to the third compression mode.

3. The method of claim 1, wherein the buffer comprises a plurality of buffers.

4. The method of claim 3, wherein
    selecting a first compression mode further comprises separately selecting a first compression mode for each of the plurality of buffers;
    monitoring an access to the buffer further comprises monitoring an access to each of the plurality of buffers; and
    selecting a second compression mode for the buffer further comprises separately selecting a second compression mode for each of the plurality of buffers based on the monitored access to each of the plurality of buffers.

5. The method of claim 3, wherein at least two of the plurality of buffers comprise different portions of a dynamic random access memory.

6. The method of claim 1, wherein selecting whether a data stored in the buffer will be compressed further comprises:
    selecting whether the set of data stored in the buffer will be indexed based on the monitored access.

7. The method of claim 1, wherein the monitored access comprises at least one of a number of accesses to the buffer, an amount of data accessed within the buffer, or a number of random accesses of data within the buffer.

8. A system for adaptive compression mode selection for memory buffers in a portable computing device (PCD), the system comprising:
    a first component in communication with the buffer, the first component configured to write a set of data into the buffer;
    a buffer format manager in communication with the first component, the buffer format manager configured to select a first compression mode for the buffer;
    a second component in communication with the buffer, the second component configured to access at least a portion of the set of data within the buffer; and
    a monitor in communication with the buffer format manager, the monitor configured to monitor the access to the buffer by the second component,
    wherein the buffer format manager is further configured to receive information from the monitor relating to the access to the buffer by the second component and select a second compression mode for the buffer based on the received information from the monitor, wherein the buffer format manager selects the second compression mode for the buffer based on:
    whether a set of data stored in the buffer will be linear or tiled based on the monitored access, and:
    whether the set of data stored in the buffer will be compressed based on the monitored access;
    wherein the first compression mode is different from the second compression mode.

9. The system of claim 8, wherein each of the first compression mode and second compression mode comprises one of a linear—uncompressed mode, a tiled—uncompressed mode, a tiled—compressed indexed mode, or a tiled—compressed index free mode.

10. The system of claim 8, wherein the buffer further comprises a dynamic random access memory, and the first component further comprises a first core.

11. The system of claim 10, wherein the second component is one of a second core or a software application.

12. The system of claim 11, wherein each of the first core and the second core is one of a central processing unit, a graphics processing unit, a processing unit for a camera, or a processing unit for a video encoder.

13. The system of claim 8 further comprising:
    a transparent format converter (TFC) in communication with the buffer and the second component, the TFC configured to receive the data from the buffer and provide the data to the second component, and
    wherein the monitor comprises a TFC monitor.

14. The system of claim 8, wherein the received information from the monitor comprises at least one of a number of times the buffer is accessed by the second component, an amount of the data within the buffer accessed by the second component, or an amount of random access of the data within the buffer by the second component.

15. The system of claim 8 further comprising:
    a second buffer in communication with the second component, wherein the buffer format manager is configured to select a first compression mode for the second buffer and wherein the second component is configured to write a second set of data into the second buffer;
    a third component in communication with the second buffer, the third component configured to access at least a portion of the second set of data within the second buffer; and
    a second monitor in communication with the buffer format manager, the second monitor configured to monitor the access to the second buffer by the third component,
    wherein the buffer format manager is further configured to receive information from the second monitor relating to the access to the second buffer by the third component and to select a second compression mode for the second buffer based on the received information from the second monitor.

16. The system of claim 15, wherein the first compression mode for the second buffer is different from the second compression mode for the second buffer.

17. A computer program product comprising a non-transitory computer usable medium having a computer readable program code embodied therein, said computer readable program code adapted to be executed to implement a method for adaptive compression mode selection for memory buffers in a portable computing device (PCD), the method comprising:
selecting a first compression mode for a buffer of the PCD; formatting the buffer to the first compression mode; monitoring an access to the buffer;
selecting a second compression mode for the buffer based on the monitored access; and formatting the buffer to the second compression mode, wherein selecting a second compression mode for the buffer based on the monitored access further comprises:
selecting whether the buffer will be linear or tiled based on the monitored access; and
selecting whether a data stored in the buffer will be compressed based on the monitored access;
wherein the first compression mode is different from the second compression mode.

18. The computer program product of claim 17, wherein the program code implementing the method further comprises instructions for:
monitoring a second access to the buffer;
selecting a third compression mode for a buffer based on the second monitored access; and
formatting the buffer to the third compression mode.

19. The computer program product of claim 17, wherein the buffer comprises a plurality of buffers.

20. The computer program product of claim 19, wherein selecting a first compression mode further comprises separately selecting a first compression mode for each of the plurality of buffers;
monitoring an access to the buffer further comprises monitoring an access to each of the plurality of buffers; and
selecting a second compression mode for the buffer further comprises separately selecting a second compression mode for each of the plurality of buffers based on the monitored access to each of the plurality of buffers.

21. The computer program product of claim 19, wherein at least two of the plurality of buffers comprise different portions of a dynamic random access memory.

22. The computer program product of claim 17, wherein selecting whether a data stored in the buffer will be compressed further comprises:
selecting whether the data stored in the buffer will be indexed based on the monitored access.

23. The computer program product of claim 17, wherein the monitored access comprises at least one of a number of accesses to the buffer, an amount of data accessed within the buffer, or a number of random accesses of data within the buffer.

24. A computer system for adaptive compression mode selection for memory buffers in a portable computing device (PCD), the system comprising:
means for selecting a first compression mode for a buffer of the PCD; means for formatting the buffer to the first compression mode; means for monitoring an access to the buffer; and means for selecting a second compression mode for the buffer based on the monitored access, wherein the means for selecting a second compression mode for the buffer based on the monitored access further comprises:
means for selecting whether the buffer will be linear or tiled based on the monitored access: and
means for selecting whether a data stored in the buffer will be compressed based on the monitored access;
wherein the first compression mode is different from the second compression mode.

25. The system of claim 24, further comprising:
means for monitoring a second access to the buffer; and
means for selecting a third compression mode for a buffer based on the second monitored access.

26. The system of claim 24, wherein the buffer comprises a plurality of buffers.

27. The system of claim 26, wherein
means for selecting a first compression mode further comprises means for separately selecting a first compression mode for each of the plurality of buffers;
means for monitoring an access to the buffer further comprises means for monitoring an access to each of the plurality of buffers; and
means for selecting a second compression mode for the buffer further comprises means for separately selecting a second compression mode for each of the plurality of buffers based on the monitored access to each of the plurality of buffers.

28. The system of claim 26, wherein at least two of the plurality of buffers comprise different portions of a dynamic random access memory.

29. The system of claim 24, wherein the means for selecting whether a data stored in the buffer will be compressed further comprises:
means for selecting whether the data stored in the buffer will be indexed based on the monitored access.

30. The system of claim 24, wherein the monitored access comprises at least one of a number of accesses to the buffer, an amount of data accessed within the buffer, or a number of random accesses of data within the buffer.

* * * * *